(12) United States Patent
Emesh et al.

(10) Patent No.: US 9,425,092 B2
(45) Date of Patent: Aug. 23, 2016

(54) METHODS FOR PRODUCING INTERCONNECTS IN SEMICONDUCTOR DEVICES

(71) Applicant: APPLIED Materials, Inc., Santa Clara, CA (US)

(72) Inventors: Ismail T. Emesh, Sunnyvale, CA (US); Roey Shaviv, Palo Alto, CA (US); Mehul Naik, San Jose, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 14/211,602

(22) Filed: Mar. 14, 2014

(65) Prior Publication Data

US 2014/0287577 A1    Sep. 25, 2014

Related U.S. Application Data

(60) Provisional application No. 61/799,703, filed on Mar. 15, 2013.

(51) Int. Cl.
```
H01L 21/76      (2006.01)
H01L 21/768     (2006.01)
H01L 23/532     (2006.01)
```
(52) U.S. Cl.
CPC ... *H01L 21/76879* (2013.01); *H01L 21/76849* (2013.01); *H01L 21/76873* (2013.01); *H01L 21/76877* (2013.01); *H01L 21/76882* (2013.01); *H01L 21/76883* (2013.01); *H01L 23/53233* (2013.01); *H01L 23/53238* (2013.01); *H01L 23/53266* (2013.01); *H01L 2221/1089* (2013.01); *H01L 2924/0002* (2013.01)

(58) Field of Classification Search
CPC .................................................. H01L 21/76877
See application file for complete search history.

(56) References Cited

U.S. PATENT DOCUMENTS

| | | | |
|---|---|---|---|
| 6,180,505 B1 * | 1/2001 | Uzoh | 438/614 |
| 6,207,222 B1 | 3/2001 | Chen | |
| 6,461,225 B1 | 10/2002 | Misra | |
| 6,710,460 B2 * | 3/2004 | Morozumi | 257/779 |
| 6,731,006 B1 | 5/2004 | Halliyal | |
| 7,087,524 B2 * | 8/2006 | Park | 438/672 |
| 7,192,495 B1 * | 3/2007 | Collins | 148/518 |
| 7,351,314 B2 | 4/2008 | Klocke | |
| 7,351,315 B2 | 4/2008 | Klocke | |

(Continued)

FOREIGN PATENT DOCUMENTS

WO     2012/133400 A1     10/2012

OTHER PUBLICATIONS

Extended European Search Report mailed Dec. 1, 2014, issued in related European Application No. 14159975.3, filed Mar. 14, 2014, 9 pages.

*Primary Examiner* — Mohammad Islam
*Assistant Examiner* — Ankush Singal
(74) *Attorney, Agent, or Firm* — Christensen O'Connor Johnson Kindness PLLC

(57) ABSTRACT

A method for producing interconnects on a workpiece includes obtaining a workpiece substrate having a feature, depositing a conductive layer in the feature, to partially or fully fill the feature, depositing a copper fill to completely fill the feature if the feature is partially filled by the conductive layer, applying a copper overburden, thermally treating the workpiece, and removing the overburden to expose the substrate and the metalized feature.

18 Claims, 15 Drawing Sheets

(56) References Cited

U.S. PATENT DOCUMENTS

| | | |
|---|---|---|
| 8,236,159 B2 | 8/2012 | Baskaran |
| 8,357,599 B2 | 1/2013 | Schieffer |
| 8,420,537 B2* | 4/2013 | Chanda et al. ............... 438/692 |
| 8,497,202 B1* | 7/2013 | Edelstein et al. ............ 438/618 |
| 2004/0012090 A1* | 1/2004 | Basol et al. .................. 257/755 |
| 2004/0219779 A1* | 11/2004 | Basol et al. .................. 438/627 |
| 2005/0009331 A1* | 1/2005 | Park ............................. 438/672 |
| 2005/0095854 A1* | 5/2005 | Uzoh et al. ................... 438/678 |
| 2005/0227479 A1 | 10/2005 | Feng |
| 2006/0091551 A1* | 5/2006 | Lin et al. ...................... 257/762 |
| 2006/0202345 A1* | 9/2006 | Barth et al. .................. 257/761 |
| 2007/0032095 A1* | 2/2007 | Ramaswamy et al. ....... 438/795 |
| 2007/0173056 A1* | 7/2007 | Kodera ......................... 438/633 |
| 2007/0238294 A1* | 10/2007 | Beyer et al. .................. 438/687 |
| 2008/0173547 A1* | 7/2008 | Ohba et al. ................... 205/123 |
| 2008/0280151 A1* | 11/2008 | Jourdan et al. ............... 428/450 |
| 2009/0020883 A1* | 1/2009 | Nomura et al. .............. 257/774 |
| 2009/0226603 A1* | 9/2009 | Lowrey .......................... 427/58 |
| 2009/0227087 A1* | 9/2009 | Ramappa et al. ............. 438/460 |
| 2009/0321934 A1* | 12/2009 | Lavoie et al. ................. 257/751 |
| 2010/0044864 A1* | 2/2010 | Maekawa et al. ............ 257/751 |
| 2010/0154213 A1* | 6/2010 | Koike et al. ................... 29/874 |
| 2010/0227473 A1* | 9/2010 | Matsuda et al. .............. 438/653 |
| 2011/0297319 A1* | 12/2011 | Chen et al. ............... 156/345.35 |
| 2012/0319279 A1* | 12/2012 | Isobayashi .................... 257/751 |
| 2013/0320505 A1* | 12/2013 | Emesh et al. ................. 257/621 |
| 2014/0008812 A1 | 1/2014 | Emesh |
| 2014/0103534 A1* | 4/2014 | Emesh et al. ................. 257/773 |

* cited by examiner

ECD SEED PLUS - PROCESS FLOW EXAMPLES

| ITEM | PROCESS FLOW | BARRIER | SEC. SEED | LINER | SEED | FLASH | ECD SEED | ECD SEED PLUS |
|---|---|---|---|---|---|---|---|---|
| 1 | MAIN DAMASCENE | 1 | | | 2 | | 3 | |
| 2 | ECD SEED (SLE) | 1 | | | 2 | | 4 | |
| 3 | ECD SEED (SLE) W/ LINER | 1 | | 2 | 3 | | 3 | |
| 4 | ECD SEED (SLE) W/ SECONDARY SEED | 1 | 2 | | | | 3 | |
| 5 | ECD SEED (SLE) W/ SEC. SEED AND FLASH | 1 | 2 | | | 3 | 4 | |
| 6 | ECD SEED (DOB) | 1 | | | | | 2 | |
| 7 | ECD SEED PLUS (DOB) | 1 | | | | | | 2 |
| 8 | ECD SEED PLUS | 1 | 2 | | | | | 3 |
| 9 | ECD SEED PLUS W/O SECONDARY SEED | 1 | | | 2 | | | 3 |
| 10 | ECD SEED PLUS W/ LINER W/ SEED | 1 | | 2 | 3 | | | 4 |

Fig. 2.

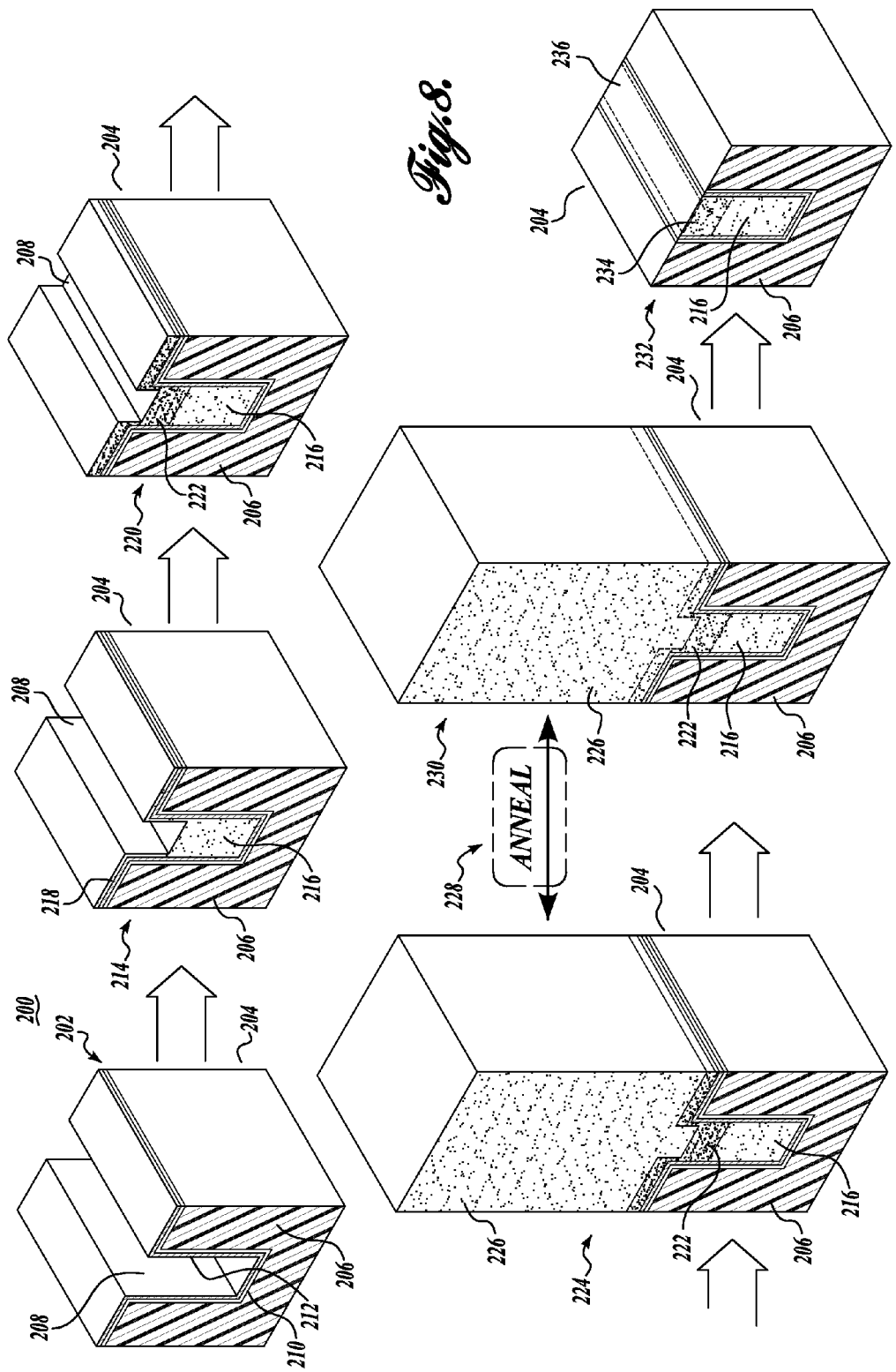

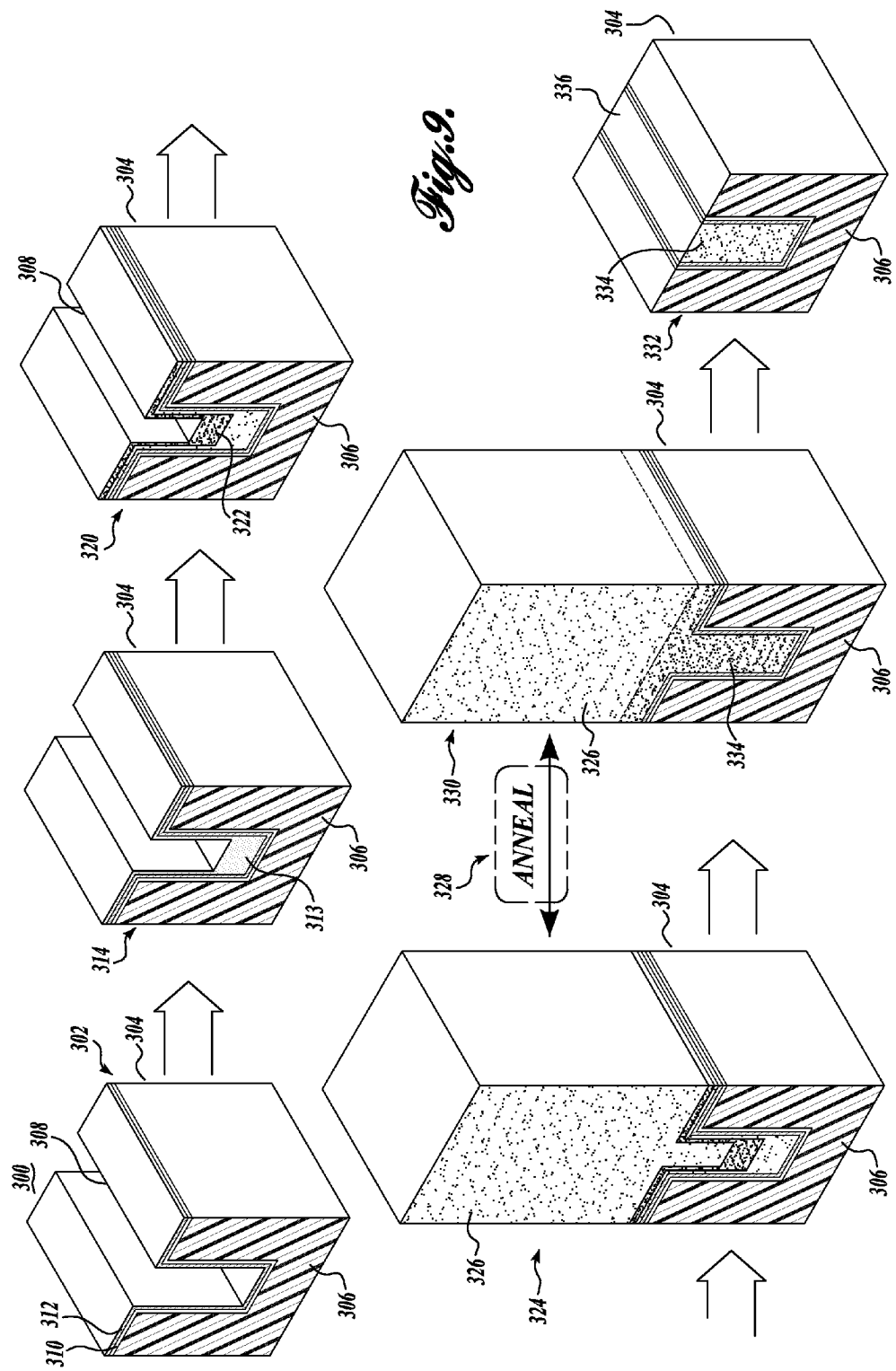

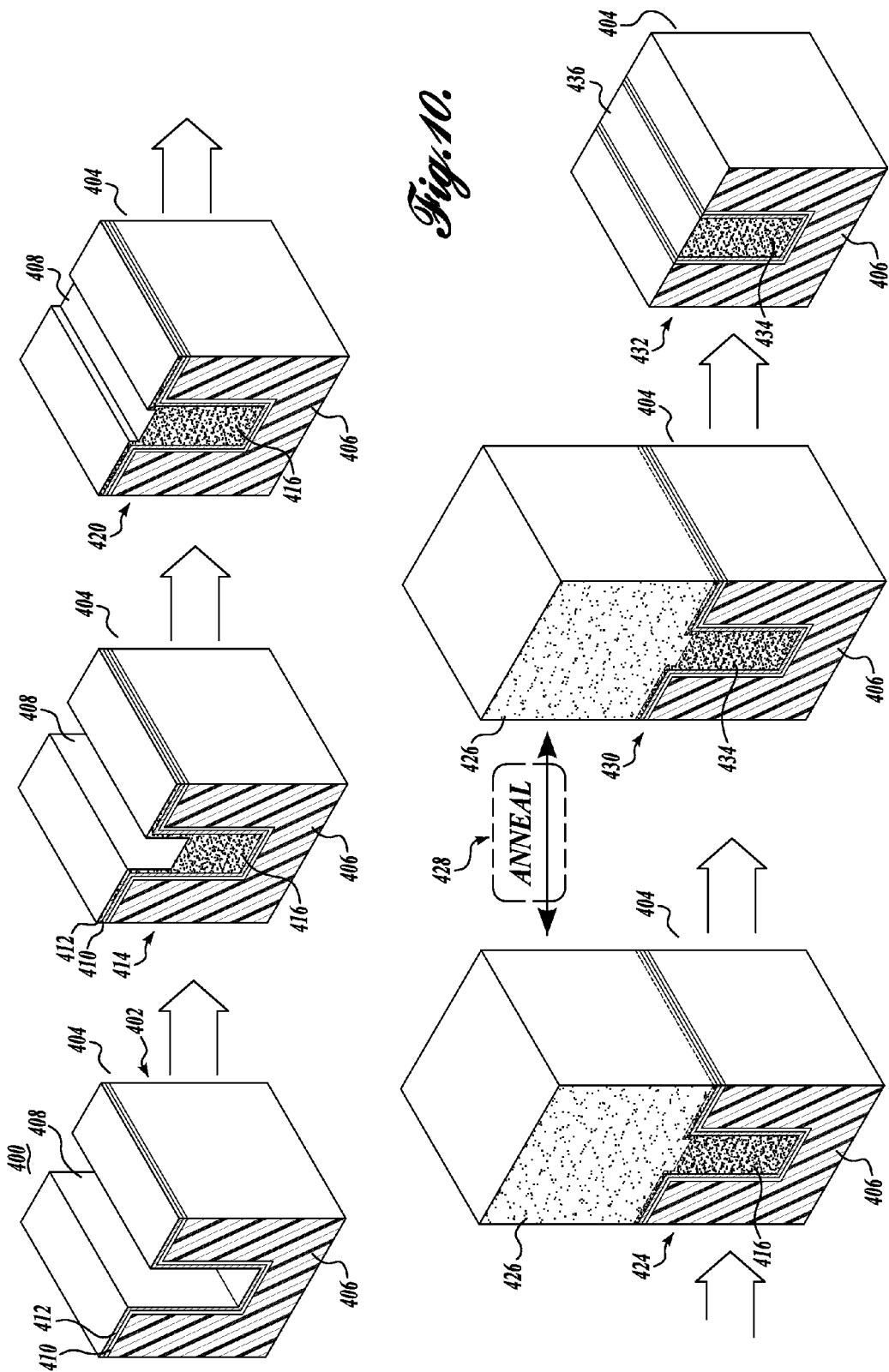

METHODS FOR PRODUCING INTERCONNECTS IN SEMICONDUCTOR DEVICES

CROSS-REFERENCE TO RELATED APPLICATION

This application claims the benefit of U.S. Provisional Application No. 61/799,703, filed Mar. 15, 2013, the disclosure of which is hereby expressly incorporated by reference herein in its entirety.

BACKGROUND

The present disclosure relates to producing interconnects in semiconductor devices. Such interconnects can be composed of selected metals and metal alloys deposited in workpiece features by electroplating and followed by thermal diffusion. Such interconnects can include selective metal caps placed over trenches or vias. Such interconnects can also include plating an etch stop over a via to create an alignment-tolerant via.

Integrated circuits (IC) include various semiconductor devices formed within or on layers of dielectric material that overlies a substrate. Such devices which may be formed in or on the dielectric layers include MRS transistors, bipolar transistors, diodes, and diffused resistors. Other devices which may be formed in or on the dielectric material include thin film resistors and capacitors. Metal lines interconnect the semiconductor devices to power such devices and enable such devices to share and exchange information. Such interconnects extend horizontally between devices within a dielectric layer as well as vertically between dielectric layers. These metal lines are connected to each other by a series of interconnects. The electrical interconnects or metal lines are first patterned into the dielectric layers to form vertical and horizontal recessed features (vias and trenches) that are subsequently filled with metal. The resulting layer containing metal-filled lines residing in a dielectric is referred to as a metallization layer.

Next, a second metallization layer is similarly formed on top of the first metallization layer and interconnects are formed between the two metallization layers. A stack containing several metallization layers which are electrically connected to each other by a plurality of interconnects can be formed using this process. This process is known as Damascene processing. Damascene processing typically employs copper (Cu) as the metallization metal. However, other metals may also be utilized, including aluminum (Al), cobalt (Co), Nickel (Ni), Gold (Au), Silver (Ag), Manganese (Mn), Tin (Sn), and alloys thereof.

The typical process of forming metal interconnections or lines, for example, from copper, requires several steps. Initially, vertical and horizontal features (vias and trenches) are patterned and formed in the dielectric substrate. Eventually the vias and trenches are filled with copper, but beforehand a barrier layer and a seed layer are applied to the feature. Because copper tends to diffuse into the dielectric material, barrier layers are used to isolate the copper deposit from the dielectric material. The diffusion of copper into the surrounding dielectric material would lead to line-to-line leakages and eventual failure of the semiconductor devices. As such, it is common to fully enclose or encapsulate copper lines with a diffusion barrier. However, if other metals are used for metallization, it is to be appreciated that barrier layers may not be needed. Barrier layers are typically made from refractory metals or refractory compounds, for example, titanium (Ti), tantalum (Ta), titanium nitride (TiN), tantalum nitride (TaN), etc. The barrier layer is commonly formed using a deposition technique called physical vapor deposition (PVD), but may also be formed using other deposition techniques, such as chemical vapor deposition (CVD) or atomic layer deposition (ALD).

A seed layer can be deposited on the barrier layer. The purpose of the seed layer can be: to provide a low-resistance electrical path which enables more uniform electrical plating over the barrier layer; and/or to assist the copper or other trench or via material to adhere well to the barrier layer, thereby to provide a continuous platable film to plate on. As such, the seed layer can be composed of a copper or copper alloy, such as copper manganese, copper cobalt, or copper nickel. The seed layer can also be composed of aluminum or an aluminum alloy. Also, various options exist for depositing a seed layer, such as using PVD for copper seed layer deposition. The seed layer may also be formed by using other deposition techniques, such as CVD or ALD.

The seed layer can be a stack film, for example, a liner layer and a PVD seed layer. A liner layer is a material used on a barrier layer or between a barrier layer and a PVD seed layer to mitigate discontinuous seed issues and improve adhesion of the PVD seed to the barrier layer. Liner layers are typically composed of noble metals, such as ruthenium (Ru), platinum (Pt), palladium (Pd), and osmium (Os). Liners can also be composed of Co or Ni. Currently, CVD Ru and CVD Co are commonly used to create liners; however, liner layers may also be formed by using other deposition techniques, including ALD or PVD.

The seed layer can also be a secondary seed layer, which is similar to a liner layer in that it is typically formed from noble metals, such as Ru, Pt, Pd, or Os. However, other materials may be utilized, including Co and Ni, and also commonly CVD Ru and CVD Co. As in seed and liner layers, secondary seed layers may also be formed using ALD, PVD, or other deposition techniques. A secondary seed layer differs from the liner layer in that the secondary seed layer actually serves as the seed layer, whereas the liner layer is an intermediate layer between the barrier layer and the PVD seed layer.

After the seed layer has been deposited, the feature may be filled with copper using, for example, electrochemical deposition under acid deposition chemistry ("ECD"). Conventional ECD copper acid chemistry may include, for example, copper sulfate, sulfuric acid, hydrochloric acid, and organic additives (such as accelerators, suppressors, and levelers). Electrochemical deposition of copper has been found to be a cost effective manner by which to deposit a copper metallization layer. In addition to being economically viable, ECD techniques provide a substantially "bottom up" (e.g., nonconformal) metal fill that is mechanically and electrically suitable for interconnected structures.

A long-standing objective in the advancement of IC technology has been the scaling down of IC dimensions. Such scaling-down of IC dimensions is critical to obtaining higher speed performance of ICs. An increase in IC performance is normally accompanied by a decrease in device area and/or an increase in device density. An increase in device density requires a decrease in via and trench dimensions (widths) used to form the interconnects. However, as feature dimensions on wafers decrease, negative consequences can come to bear. For example, reduced-size features may result in less reliable interconnects.

A conventional copper fill to produce interconnects can result in voids, particularly in features having a size of less than 30 nm. As one example of a type of void formed using conventional copper deposition, the opening of the feature may pinch off. Other types of voids can also result from using conventional copper fill process in small features. Such voids and other intrinsic properties of a deposit formed using conventional copper fill techniques can increase the resistance of the interconnect, thereby slowing down electrical performance of the device and reducing the reliability of the copper interconnect.

A further result of the ever-decreasing scaling down of interconnects is electromigration failure. Electromigration redistributes the copper in the interconnect and creates extrusions that can expand into the dielectric space. Generally, electromigration occurs when the metal atoms of conductive lines are subjected to high current density when the circuit is in operation. Metal atoms migrate in the direction of electron flow if the current density is high enough, thereby forming voids where metal ions have departed and forming extrusions consisting of metal material protruding outside the metal or dielectric barrier along the length of the metal interconnect. Voids will cause the copper interconnect to thin out and eventually separate completely, causing an open circuit. Moreover, extrusions can cause the copper metal to extend past the copper interconnect and into an adjacent copper line, thereby causing a short circuit.

With increasing miniaturization of integrated circuits, the likelihood of failure of interconnects due to electromigration increases with copper interconnects, because failure is caused by smaller voids. This necessitates a remedy to electromigration failures.

Once a void begins to develop in a metal line, the conducting metal becomes narrower at that point. Due to the reduction in conductor cross section, current density through the line increases at the narrowed location. As a result, the interconnect temperature increases due to Joule heating. As the temperature of the interconnect rises, the growth of the void accelerates, leading to a vicious cycle that eventually results in an open circuit.

One solution to reducing or minimizing electromigration is to apply a metal cap over the copper fill. However, the process of producing the metal cap can be time-consuming and expensive. Perhaps more importantly, in existing methods for producing a metal cap, metal residue can remain that extends between the metal lines, eventually causing a short circuit or other failure to occur.

In one method of forming a metal cap, after a metal liner has been deposited on the sidewalls and bottom surface of a feature, the metal layer is electroplated on the metal liner to fill the feature with, for example, copper. Typically, the metal layer overlies the dielectric layer in which the feature exists. As such, it is necessary to planarize the metal lining to be coextensive with the top layer of the dielectric surface. This can be carried out by, for example, chemical mechanical polishing (CMP). As a result, the top surface of the metal layer is now substantially coplanar with the dielectric layer top surface.

Next the metal line is recessed below the level of the dielectric layer top surface by an etching process selective to the metal liner and the dielectric layer. In this manner, the amount of removal of the metal liner and dielectric layer is insignificant relative to the removal of material from the surface of the metal line. Next, a cap layer is deposited over the recessed surface of the metal line as well as over the top edges of the sidewalls of the metal liner and over the dielectric layer top surface. Typically, the thickness of the cap layer is from about 5 nm to about 100 nm, but more commonly from about 12 nm to about 50 nm. Next, a further planarization process is carried out so that the top surface of the cap is coextensive with the top surface of the dielectric layer.

In another process for achieving a metal cap on copper or other conductor used for interconnects, after the copper is otherwise plated or deposited into the feature formed in the dielectric material, the wafer is planarized, for example, by CMP processing. ThereafterNext, a further thin dielectric cap is formed over the metal blanket film. Next, a photoresist coating is deposited over the thin dielectric cap, and a lithographic exposure process is performed using a lithographic mask. In this manner, the Ta/TaN metal cap between the copper lines is etched away, leaving the metal cap only over the copper lines. However, in this process, not uncommonly, a residue may be left between the copper lines, which could eventually result in shorting the lines, or other reliability problems, especially as the lines become thinner and thinner.

One way, of course, of addressing the drawbacks of copper metallization is to use a copper alloy or a metal other than copper, for example, Co, Ni, Mn, Sn, Au, Ag, Al, or alloys thereof. Plating or otherwise depositing these metals in small features can, as in plating copper, result in low quality interconnects due to the formation of defects including voids. These voids, as noted above, can reduce the performance of the semiconductor circuit and also reduce the reliability of the metal interconnect.

Another consequence of increasing the density of IC device density is that it becomes more difficult to avoid interconnects in adjacent semiconductor layers. As a consequence, when locating semiconductor devices and/or features for interconnects, it is difficult to void interconnects on a pre-existing layer. It would be desirable if alignment-tolerant vias could be incorporated into interconnects.

The present invention is intended to address the foregoing issues, as well as provide improved performance and reliability of interconnects used in semiconductor manufacturing.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A method for forming an interconnect in a workpiece includes obtaining a workpiece substrate having a feature therein, depositing a metal conductive layer in the feature to partially or fully fill the feature, depositing a metal fill to complete the filling of the feature if the feature is partially filled by the conducting layer, applying a copper or other metal overburden, annealing the workpiece and then using CMP to remove the overburden and reduce the height of the workpiece to expose the substrate and the metalized feature.

In accordance with a further aspect of the present disclosure, the metal for the conductive layers is selected from the group consisting of copper, cobalt, nickel, gold, silver, manganese, tin, aluminum and alloys thereof.

In a further aspect of the present disclosure, the conductive layer partially fills the feature and then metal alloys deposited to further partially fill or completely fill the feature before the copper or other metal overburden is applied.

In a further aspect of the present disclosure, the annealing of the workpiece is carried out in a controlled manner to limit the diffusion of the alloy material to the upper portion of the feature.

In accordance with a further aspect of the present disclosure, the annealing of the workpiece is carried out to cause the alloy of the metal layer to uniformly diffuse throughout the feature.

In a further aspect of the present disclosure, the workpiece is thermally treated to induce reflow of the conductive layer into the feature to create a conformal conductive layer.

In a further aspect, the present disclosure provides a method for filling a feature in a workpiece, with the method comprising obtaining a workpiece substrate including a feature for an interconnect, depositing a metal conductive layer in the feature to partially or fully fill the feature, depositing in a metal fill if the feature is partially filled by the metal conductive layer, applying a metal overburden to the workpiece, including to overlie the feature, thermally treating the workpiece under conditions to anneal the workpiece, and using CMP to remove the overburden and expose the upper surface of the substrate.

In accordance with another aspect of the present disclosure, the conductive layer partially fills the feature and then the metal alloy is deposited to further partially fill or completely fill the feature before the metal fill or the metal overburden is applied.

In a further aspect of the present disclosure, the metal alloy is an etch stop material.

In a further aspect of the present disclosure, a metal alloy is selected from the group consisting of copper alloy, a cobalt alloy, a nickel alloy, a gold alloy, a silver alloy, a manganese alloy, a tin alloy, and an aluminum alloy.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 2 is a comparison chart of exemplary initial process steps that may be used in conjunction with prior art processes and processes according to embodiments of the present disclosure;

FIG. 8 is a schematic process diagram depicting subsequent process steps to the initial steps shown in FIGS. 1-7, wherein the present process is used to apply a selected metal cap to a dual Damascene structure;

FIG. 9 is a schematic process diagram similar to that shown in FIG. 8, illustrating the deposition of bronze or other alloy interconnects;

FIG. 10 is a schematic process diagram depicting a further method of the present disclosure depicting a process sequence for the deposition of cobalt or cobalt alloy interconnects;

DETAILED DESCRIPTION

Figure 1:
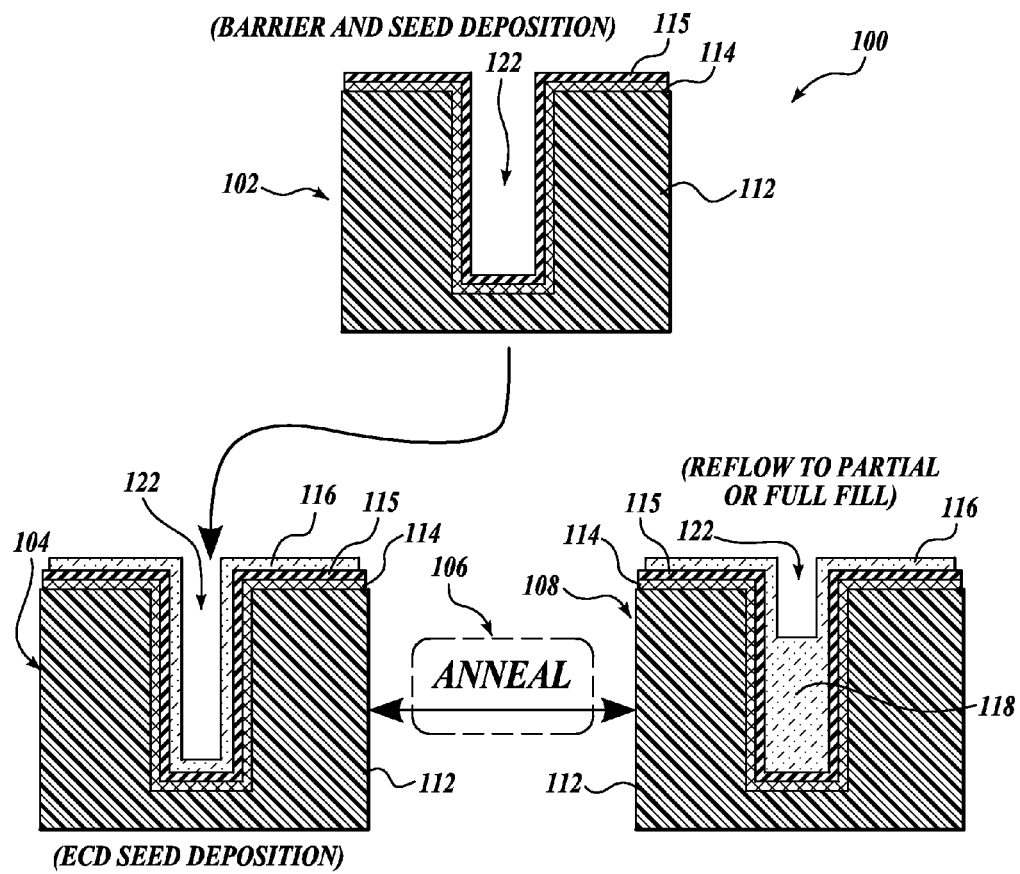
FIG. 1 is a schematic flow diagram depicting initial process steps and an exemplary feature development of an exemplary embodiment of the present disclosure.

Embodiments of the present disclosure are directed to workpieces, such as semiconductor wafers, devices or processing assemblies for processing workpieces, and methods of processing the same. The terms workpiece, wafer, and semiconductor wafer mean any flat media or article, including semiconductor wafers and other substrates or wafers, glass, mask, and optical or memory media, MEMS substrates, or any other workpiece having micro-electric, micro-mechanical, or microelectro-mechanical devices.

Processes described herein are to be used for producing interconnects in the features of workpieces which include trenches and vias. In one embodiment of the present disclosure, the process may be used to produce small feature interconnects, for example, features having a width or diameter of less than 30 nm. However, it should be appreciated that the processes of the present disclosure are applicable to any feature size. The dimension sizes discussed in the present application are post-etch feature dimensions at the top opening of the feature. The processes described herein may be applied to various forms of copper, cobalt, nickel, gold, silver, manganese, tin, aluminum, and alloy deposition, for example, in Damascene applications, both single and double Damascene application. In embodiments of the present disclosure, Damascene features may be selected from the group consisting of features having a size of less than 30 nm, about 5 to less than 30 nm, about 10 to less than 30 nm, about 15 to about 20 nm, about 20 to less than 30 nm, less than 20 nm, less than 10 nm, and about 5 to about 10 nm.

It should be appreciated that the descriptive terms "microfeature workpiece" and "workpiece" as used herein include all structures and layers that have been previously deposited and formed at a given point in the processing, and are not limited to just those structures and layers as depicted in the Figures.

Although generally described as metal deposition in the present application, it should be appreciated that the term "metal" also contemplates metal alloys. Such metals and metal alloys may be used to form seed layers or to fully or partially fill the feature. Exemplary copper alloys may include, but are not limited to, copper manganese and copper aluminum. As a non-limiting example, the alloy composition ratio may be in the range of about 0.5% to about 6% secondary alloy metal, as compared to the primary alloy metal (e.g., Cu, Co, Ni, Ag, Au, Mn, Sn or Al).

As described above, the conventional fabrication of metal interconnects may include a suitable deposition of a barrier layer on the dielectric material to prevent the diffusion of metal into the dielectric material. Suitable barrier layers may include, for example, Ta, Ti, TiN, TaN, Mn, or MnN. Suitable barrier deposition methods may include PVD, ALD and CVD; however, PVD is the most common process for barrier layer deposition. Barrier layers are typically used to isolate copper or copper alloys from dielectric material; however, it should be appreciated that in the case of other metal interconnects, diffusion may not be a problem and so a barrier layer may not be required.

The barrier layer deposition may be followed by an optional seed layer deposition. In the case of depositing metal in a feature, there are several options for the seed layer. As described above, the seed layer may be (1) a seed layer (as a non-limiting example, a PVD copper seed layer), (2) a stack film composed of a liner layer and a seed layer (as a non-limiting example, a CVD Ru liner layer and a PVD copper seed layer), or (3) a secondary seed layer (as a non-limiting example, a CVD or ALD Ru secondary seed layer). It should be appreciated, however, that other methods of depositing these exemplary seed layers are contemplated by the present disclosure.

The seed layer may be a metal layer, such as copper, cobalt, nickel, gold, silver, manganese, tin, aluminum, ruthenium, and alloys thereof.

As discussed above, a liner layer is a material used as an alternative seed or to help mitigate discontinuous seed issues and improve adhesion of the seed layer. Liners are typically noble metals such as Ru, Pt, Pd, and Os, but the list may also include Co and Ni. Currently, CVD Ru and CVD Co are common liners; however, liner layers may also be formed by using other deposition techniques, such as PVD or ALD. The thickness of the liner layer may be in the range of around 5 Angstroms to 50 Angstroms for Damascene applications.

Also discussed above, a secondary seed layer is similar to a liner layer in that it is typically formed from noble metals such as Ru, Pt, Pd, and Os, but the list may also include Co and Ni, and also commonly CVD Ru and CVD Co. The difference is that the secondary seed layer serves as the seed layer, whereas the liner layer is an intermediate layer between the barrier layer and the seed layer. Secondary seed layers may also be formed by using deposition techniques other than CVD, such as PVD or ALD.

The liner or secondary seed deposit may be thermally treated or annealed at a temperature between about 100° C. to about 500° C. in a forming gas environment (e.g., 3-5% hydrogen in nitrogen or 3-5% hydrogen in helium) to remove any surface oxides, densify the secondary seed or liner layer, and improve the surface properties of the deposit. The liner or secondary seed deposit may additionally be passivated by soaking in gaseous nitrogen (N2 gas) or other passifying environments to prevent surface oxidation. Passivation of the liner or secondary seed is described in U.S. Pat. No. 8,357,599, issued Jan. 22, 2013, the disclosure of which is herein expressly incorporated by reference in its entirety.

After a seed layer has been deposited (such as one of the non-limiting examples of PVD copper seed, PVD copper seed including CVD Ru liner, or CVD Ru secondary seed, or another deposition metal or metal alloy, layer combination, or deposition technique), the feature may include a conformal metal layer after the seed layer. It should also be appreciated, however, that a conformal metal layer may be deposited directly on the barrier layer, i.e., without a seed layer.

In one embodiment of the present disclosure, the conformal metal layer is deposited using an ECD seed process, and then may be modified using a process that is referred to as ECD seed "plus" deposition (or ECD seed "plus"), which includes a thermal treatment step. In other embodiments of the present disclosure, the conformal metal layer may be deposited using CVD, ALD, or other deposition techniques. In accordance with embodiments of the present disclosure, the conformal layer is flowable when subjected to thermal treatment or annealing.

In this embodiment, ECD seed "plus" generally refers to ECD metal seed deposition plus a thermal treatment step, such as an annealing step. In one embodiment of the present disclosure, the thermal treatment step may result in reflow of some or all of the seed deposition. In contrast to conventional ECD metal fill (using acid chemistry), ECD seed "plus" deposition is similar to ECD seed deposition (using basic chemistry), but adds a thermal treatment step. Moreover, instead of just depositing a seed layer, ECD seed "plus" can be performed so as to partially or fully fill the features. With the ECD seed "plus" process, substantially void-free fill of small features can be achieved. The ECD seed "plus" process is described in U.S. provisional application Nos. 61/638,851 and 61/638,856, incorporated herein by reference, and in corresponding U.S. patent application Ser. Nos. 13/801,786 and 13/801,860, also incorporated herein by reference.

The chemistry used in the ECD chamber for ECD seed "plus" deposition may include a basic chemistry, for example, Cu(ethylenediamine)2 at a pH in the range of about 8 to about 10, and in one embodiment of the present disclosure about 9.3. It should be appreciated, however, that acidic chemistries using proper organic additives may also be used to achieve conformal ECD seed deposition.

After ECD seed deposition, the workpiece may then be subjected to the spin, rinse, and dry (SRD) process or other cleaning processes. The ECD seed is then heated at a temperature warm enough to get the seed to reflow, but not too hot such that the workpiece or elements on the workpiece are damaged or degraded. For example, the temperature may be in the range of about 100° C. to about 500° C. for seed reflow in the features. Appropriate thermal treatment or annealing temperatures are in the range of about 100° C. to about 500° C., and may be accomplished with equipment capable of maintaining sustained temperatures in the range of about 200° C. to about 400° C., and at least within the temperature range of about 250° C. to about 350° C.

The thermal treatment or annealing process may be performed using a forming or inert gas, pure hydrogen, or a reducing gas such as ammonia (NH3). During reflow, the shape of the deposition changes, such that the metal deposit may pool in the bottom of the feature. In addition to reflow during the thermal treatment process, the metal deposit may also grow larger grains and reduce film resistivity. An inert gas may be used to cool the workpiece after heating.

The ECD seed deposition and reflow steps may be repeated to ensure the desired level of filling of the feature with ECD seed. In this regard, processes described herein may include one or more ECD seed deposition, cleaning (such as SRD), and thermal treatment cycles.

FIG. 1 illustrates a reflow process 100 and exemplary features created by the reflow process are depicted. The workpiece 112 may be in an exemplary embodiment a dielectric material on a crystalline silicon substrate that contains at least one feature 122. In exemplary step 102, the feature 122 is lined with a barrier layer 114 and then a seed layer 115. In exemplary step 104, the feature 122 of the workpiece 112 has received a layer of ECD seed material 116 on the seed layer 115. In exemplary anneal step 106, the workpiece is annealed at an appropriate temperature to induce the exemplary reflow step 108 to encourage partial fill. During the anneal step, ECD seed material 116 flows into the feature 122 to form a fill section 118. In an exemplary embodiment, ECD seed deposition step 104, anneal step 106, and reflow step 108 may be repeated to attain the desired characteristics of fill 118. The number of repeating steps may depend on the structure. Once fill 118 reaches desired dimensions, the remaining steps of the present process are carried out, as discussed below.

Figure 3:
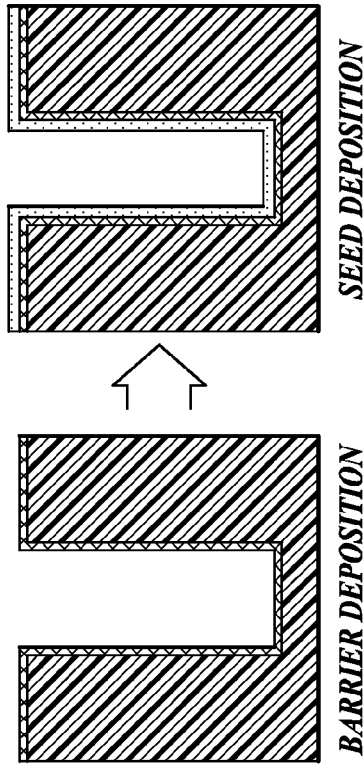
FIG. 3 is a schematic process diagram depicting initial process steps and an exemplary feature development using a prior art main Damascene process, including barrier deposition and seed deposition.
Figure 4:
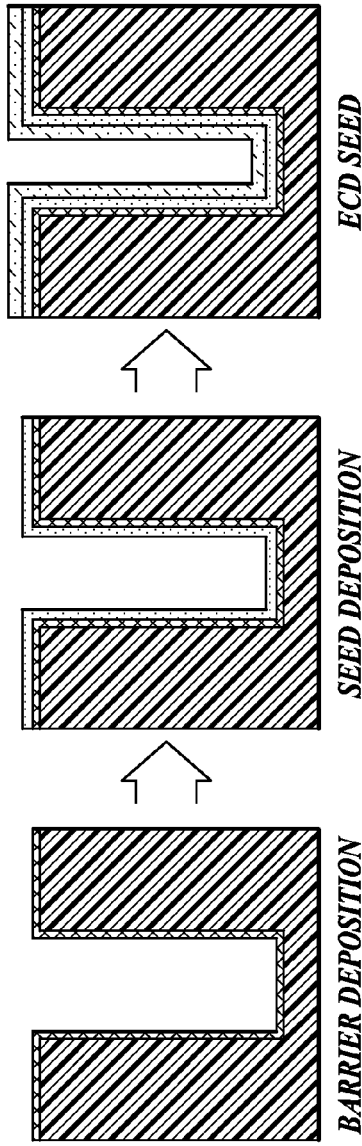
FIG. 4 is a schematic process diagram depicting initial process steps and an exemplary feature development using a prior art SLE (also know as ECD seed) process, including barrier deposition, seed deposition, and ECD seed deposition.
Figure 5:
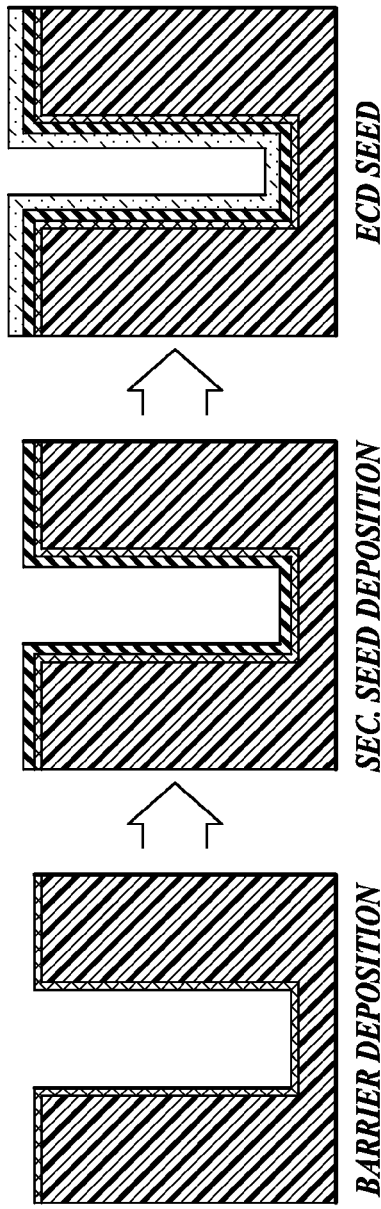
FIG. 5 is a schematic process diagram depicting initial process steps and an exemplary feature development using a prior art ECD seed process, including barrier deposition, secondary seed deposition and ECD seed deposition.
Figure 6:
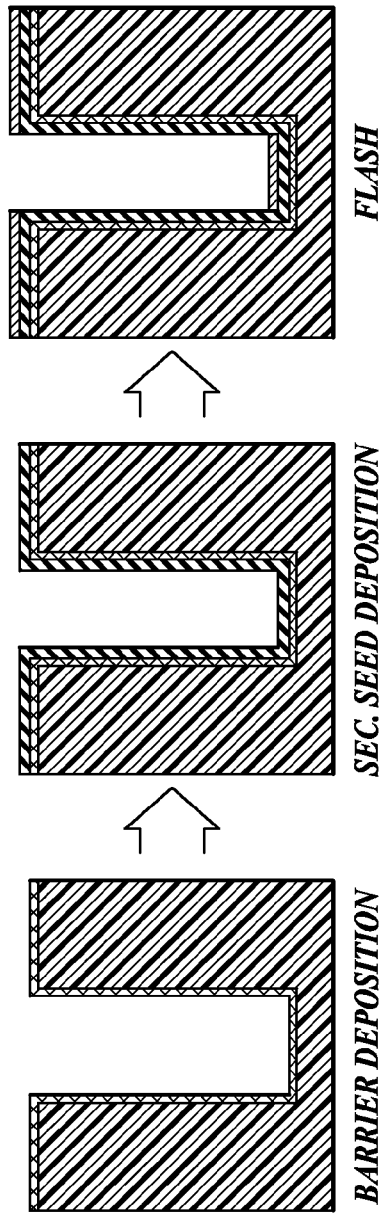
FIG. 6 is a schematic process diagram depicting initial process steps and an exemplary feature development using a prior art deposition on secondary seed process with a flash layer, including barrier deposition, secondary seed deposition, and flash deposition.

FIG. 2 is a chart of the various combinations of initial, previously developed processes that might be utilized with the present disclosure. Some combinations of previously developed processes include the following. First, the Main Damascene process includes deposition of a barrier layer and a seed layer (see FIG. 3). Second, the ECD Seed (also known as SLE) process includes deposition of a barrier layer, a seed layer and an ECD seed layer (see FIG. 4). Third, the ECD Seed (SLE) with Liner process includes deposition of a barrier layer, a liner layer, a seed layer, and an ECD seed layer (see FIG. 5). Fourth, the ECD Seed (SLE) with Secondary Seed process includes deposition of a barrier layer, a secondary seed layer, and an ECD seed layer. Fifth, the ECD Seed (SLE) with Secondary Seed and Flash process includes deposition of a barrier layer, a secondary seed layer, a flash layer, and an ECD seed layer (see FIG. 6). Sixth, the ECD Seed (also known as DOB) process includes deposition of a barrier layer and an ECD seed layer.

Figure 7:
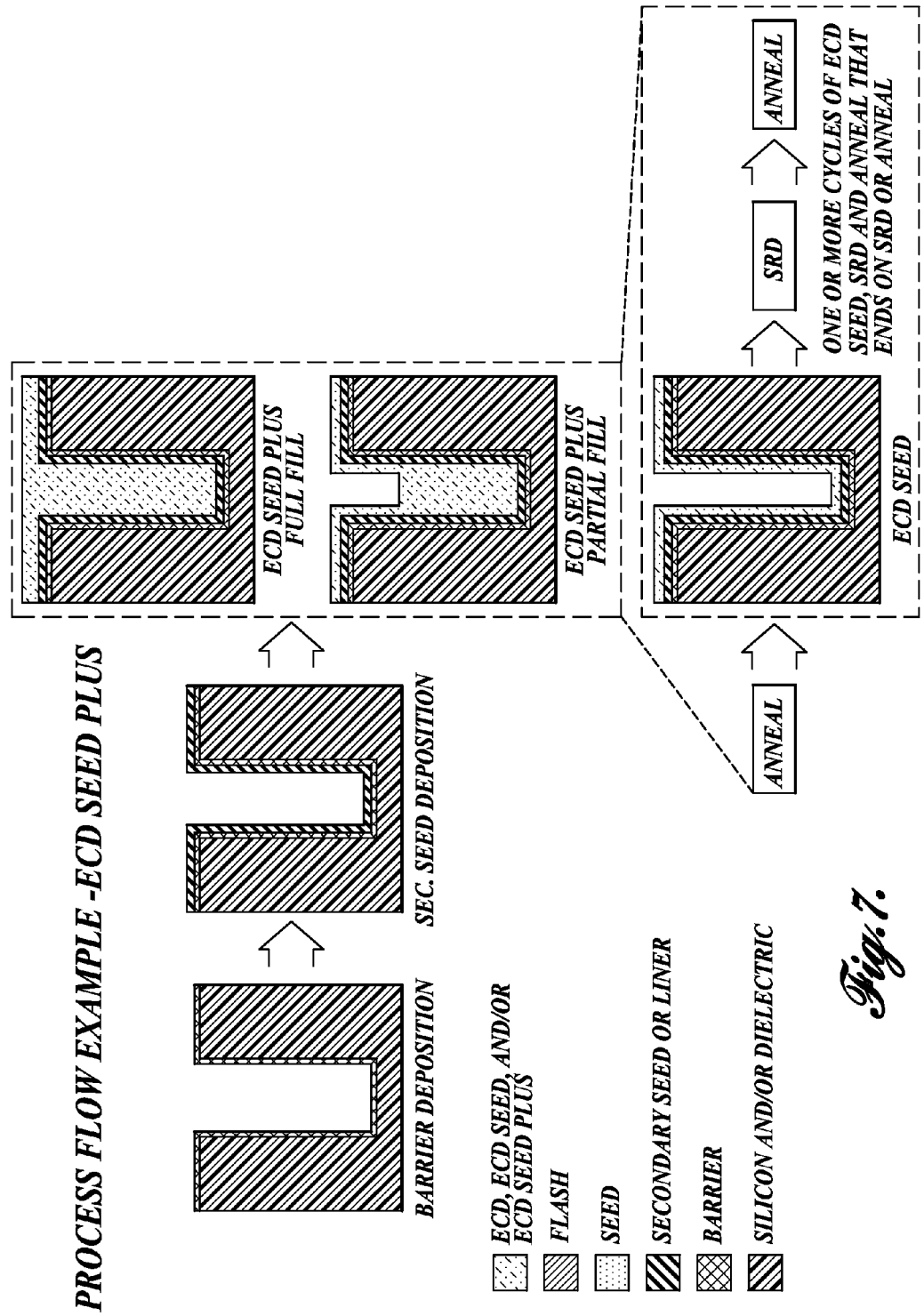
FIG. 7 is a schematic process diagram depicting the process steps and an exemplary feature development of a number of exemplary embodiments of the present disclosure, incorporating the ECD seed "plus" process.

Additional pre-existing processes in accordance with embodiments of the present disclosure include: seventh, designated as the ECD Seed Plus (DOB) process, which includes deposition of a barrier layer and an ECD seed "plus" layer. Eighth, the ECD Seed Plus process includes deposition of a barrier layer, a secondary seed layer, and an ECD seed "plus" layer. Ninth, the ECD Seed Plus Without Secondary Seed process includes deposition of a barrier layer, a seed layer, and an ECD seed "plus" layer (see FIG. 7). Tenth, the ECD Seed Plus With Liner and Seed process includes deposition of a barrier layer, a liner layer, a seed layer, and an ECD seed "plus" layer.

One embodiment of the present disclosure as applied to a dual Damascene application is shown in FIG. 8. As noted above and as shown in FIG. 8, the process 200 of the present disclosure starts at step 202 with a workpiece 204 having a dielectric 206 on a crystalline silicon wafer (not shown), which has been processed to the point of presenting a feature 208 that has been plated in step 202 with a barrier layer 210, as described above, and thereafter a seed layer 212 and/or platable film applied in a manner described above (see FIG. 8). In the next step 214 of the process, the feature 208 is partially filled with copper 216 or other metal. This step 214 can be carried out using the ECD seed "plus" process described above, which includes applying a layer of ECD seed material 218 to the seed layer 212 and then performing a thermal treatment. This annealing step induces reflow of the copper or other metal into the feature 208 to form a partial fill section. The ECD seed deposition step, the anneal step, and the reflow step can be repeated to achieve the desired characteristics of fill 216. The number of times such steps are repeated may depend on the desired structure.

Alternatively, the feature 208 could be partially filled by ECD plating using conventional acid chemistry, which is typically a faster process than using ECD seed. Of course, other processes may also be employed in place of copper plating, for example, PVD or CVD.

Next, in step 220, a copper alloy (or other metal alloy) layer 222 is applied over the partial copper (metal) fill, thereby creating a laminated copper structure, as shown in FIG. 8. This copper alloy layer may be applied by plating or other deposition techniques. FIG. 8 illustrates the copper alloy layer as being relatively thin and not filling the feature 208 to the upper surface of the dielectric 206. However, the alloy can be plated or otherwise deposited so that the feature 208 is entirely filled, and even such that the copper alloy 222 forms an overburden on the dielectric and otherwise covers the workpiece 204 and possibly the entire workpiece. As such, the copper alloy can be applied in various thicknesses. It is thought to be desirable that a minimum thickness for the copper alloy would be about 10 Å.

The plating of the copper alloy can be carried out using basic chemistry. Alloying or doping elements can consist of any transition or noble metal that assists in reducing electromigration. Such alloys could include Ag, Au, Co, Ni, Hf, Mn, Pd, Pt, Ti, Zi, or Zr, or other metals that are well known to persons skilled in the art. Other doping elements can also be utilized, such as Al, Ge, S, Se, Si, Sn, and Te.

It is also within the present disclosure that more than one copper alloy layer will be utilized. For example, a first layer can be composed of a first copper alloy, followed by a second layer of another copper alloy. Also, the copper can be alloyed with more than one dopant. For example, the copper alloy(s) can consist of Co and AG, Co and Au Co and Ti, etc.

The metal layer 222 can be deposited by various techniques in addition to electroplating. Such techniques can include PVD, CVD, or ALD deposition techniques. Moreover, the total thickness of the metal layer(s) can be less than 500 Å, and could be as thin as 20 Å.

The next step 224 in the process is the application of copper to fill the feature 208 and the creation of an overburden layer 226, as shown in FIG. 8. Although copper is the preferred metalizing material, other metals can also be utilized, for example, Co, Ni, Au, Ag, Mn, Sn, W and Al. While one method for applying the metal fill and overburden layer 226 is by electroplating, other metallization techniques can also be utilized, such as CVD or PVD. The copper overburden can be applied in various thicknesses from 200 nm to 1,000 nm. This thickness provides a basis for the CMP process, as described below.

The next step 228 in the process of the present disclosure is to anneal the structure. The annealing process has several effects, including a controlled diffusion of the alloy from the layer 222 in the adjacent top portion of the underlying copper fill 216 located in the feature 208.

Annealing is carried out at a high enough temperature to induce alloy migration or diffusion, but not so hot that the workpiece or elements on the workpiece may be damaged or degraded. In this regard the temperature range may be from about 100° C. to about 400° C. for successful annealing to occur. The annealing is carried out by using a furnace or other equipment capable of maintaining a sustained temperature in the required range. As can be appreciated, the temperature of the annealing process and its time duration can depend on the composition of the copper alloy and the extent of diffusion of the alloy desired.

The annealing process may be performed using a forming or inert gas, pure hydrogen, or a reducing gas, such as ammonia ($NH_3$). During annealing, thermal energy assists the alloy metal in layer 222, to chemically bond with the copper atoms in the adjacent portions of the copper fill 216. At the end of the annealing process, an inert gas may be used to cool the workpiece after heating. The annealed workpiece can change the electrical and other properties of the alloy layer 222.

As shown in FIG. 8, after the annealing has been carried out in step 232, CMP procedures are used to remove the copper overburden and the material layers overlying the upper surface of the dielectric. This leaves a selective cap 234 that is coextensive with the top surface 236 of the dielectric 206. As noted above, this cap improves electromigration performance of the line by serving as a shunt layer. Also, the cap promotes adhesion with the next metallization layer, which also enhances electromigration performance.

This cap may be of a thickness sufficient to perform its function of improving electromigration performance. In one example, the cap may be of a thickness of from about 5 to 1000 nm.

Moreover, by performing the CMP process, no alloy residue remains between lines, which is a clear advantage over existing methods for producing metal caps. Further metallization layers may be applied over cap 234, in which case adhesion to the metal cap is promoted by using the above process.

FIG. 9 discloses a further embodiment of the present disclosure. As shown in FIG. 9, the process 300 begins at step 302 with a workpiece 304 that includes a dielectric 306 on a crystalline silicone wafer (not shown). The dielectric 306 has been processed to the point of presenting a feature 308 that has been plated first in step 302 with a barrier layer 310, as described above. Thereafter, a seed layer 312 and/or a platable film can be applied over the barrier layer 310 in a manner described above.

The next step 314 in the process is to partially fill the feature 308 with copper (or other metal), labeled as 313. This partial fill 313 can be carried out using the ECD seed "plus" process described above, which includes applying a layer of ECD seed material onto the seed layer, and then performing a thermal treatment. This annealing step induces reflow of the copper down into the feature 308 to form a partial fill section. The ECD seed deposition step, the anneal step, and the reflow step can be repeated to achieve the desired characteristics of fill 308. The number of times such steps are repeated may depend on the desired structure of the partial fill 308.

In a manner described above with respect to FIG. 8, alternatively, the feature 308 may be partially filled by ECD plating using conventional acid chemistry, which is typically faster than using the ECD seed, but perhaps not as effective in eliminating voids and other discontinuities in the partial fill. Of course, other processes may be employed in place of copper plating to achieve the partial fill 313, for example, PVD or CVD.

Next, in step 320, a copper alloy 322 is plated or otherwise deposited over the partial copper fill 313. This step may be the same or very similar to the alloying step 220 described above with respect to FIG. 8. As described above with respect to FIG. 8, various alloying metals or combinations of alloying metals may be utilized. Also, more than one metal alloy layer may be plated or deposited over the partial fill.

In the next step 324, copper (or other metal) is deposited to fill the feature 308 and create an overburden layer 326, as shown in FIG. 9. One method for applying the copper fill and the overburden layer 326 is by electroplating, which is relatively fast and economical relative to other deposition methods, which also could be used.

Next, in step 328, the workpiece 304 is annealed in the manner described above with respect to FIG. 9. However, unlike in FIG. 9, the post-plating anneal here is carried out to distribute the alloying element in the alloy 322 throughout the copper disposed in the feature 308. In essence, a copper alloy (bronze) metallization interconnect 334 is created wherein the alloying element is diffused substantially uniformly throughout the copper fill.

As noted above, the doping elements used to create the copper alloy may include any transition or noble metal that assists in reducing electromigration. Such metals are listed above. In addition to those metals listed above, the alloying elements could include any bronze forming element or combination thereof. In this regard, in order to effectively plate a bronze film, it is necessary to co-plate the copper with another element. Also, in some embodiments of the present disclosure, two or more elements are co-plated with the copper. Complexes of the doping elements are needed in most situations, but not all, for effective plating to occur. Typical examples of such chemistry for CuCo bronze utilizes Co and Cu ethylenediamine complexes. Such complexes are known to those skilled in the art. Also, the pH level and concentrations of plating solution are adjusted appropriately in order to facilitate controlling the co-plating of the elements to form the desired bronze interconnect.

After annealing has been completed so that the alloying element is diffused throughout the feature 308 in step 330, next, in step 332, CMP procedures are used to remove the copper overburden, as well as all layers above the dielectric 306, so that the top surface 336 of the bronze interconnect 334 is coplanar with the top surface dielectric 306. Such interconnect 334 can provide the same advantages as provided by the selective cap 332 described above with respect to FIG. 9. In this regard, while the electrical resistance of the bronze interconnect may be somewhat higher than the resistance of copper, the interconnect is less likely to be subjected to electromigration and the detrimental effects thereof.

FIG. 10 discloses a further embodiment of the present disclosure where cobalt (Co) is used as the interconnect material. As shown in FIG. 10, the interconnect process 400 begins at step 402 with a workpiece 404 that includes a dielectric 406 over a crystalline silicon wafer (not shown). Dielectric 406 has been processed to a point of presenting a feature 408. In the first step 402, an optional barrier layer 410 can be applied to the surface of the feature. The barrier may be composed of a metal or a compound, including, for example, Mn, MnN, Ti, Ta, TiN, TaN, etc. A seed layer 412 and/or a platable film can be applied over the barrier layer 410 in a manner described above, for example, by CVD. The seed layer can be composed of CVD Co, or a cobalt alloy. Rather than using CVD, a seed layer can also be formed using PVD, or ALD, or other deposition techniques.

The next step 414 in the process is to partially or entirely fill the feature 408 with cobalt or cobalt alloy, labeled as 416. This partial or full fill process can be carried out using the ECD seed "plus" process described above. This process, which results in a void-free fill, includes applying a layer of ECD seed material on the seed layer, and then performing a thermal treatment. This annealing step induces reflow of the cobalt 416 into the feature 408 to form the fill section. The ECD seed deposition step, the anneal step, and the reflow step can be repeated as shown in step 420 to achieve the desired characteristics of the fill 416 with the number of times the ECD deposition step is carried out depending on the desired structure of the fill 416.

It will be appreciated that this process enables plating of the cobalt on high sheet resistance films up to 1000 Ω/□.

Next, in step 424, copper is deposited to fill the feature 408, if not already filled with the cobalt, and create an overburden layer 426. As discussed above, one desirable deposition process is to apply the copper fill and the overburden by electroplating, which is relatively fast and economical relative to other deposition methods, which also could be used.

Next in step 428, the workpiece is annealed in a manner described above with respect to FIGS. 8 and 9. One primary purpose of this heat treatment is to achieve a uniform alloy material composition in the feature 408. The annealing process can be carried out in a manner that is similar or substantially the same as described above with respect to FIGS. 8 and 9.

After annealing has been completed in step 432, CMP procedures are used to remove the copper overburden as well as any material layers over the dielectric 406, as shown in FIG. 10, thereby to leave a cobalt or cobalt alloy interconnect 434. The top 436 of the interconnect 434 is coextensive with the top surface of the dielectric 406. As noted above, this interconnect procedure helps resolve cladding and, as a result, helps to reduce line resistance issues as well as the electromigration problems that commonly occur when copper is used for metallization.

FIG. 11 discloses a further embodiment of the present method applied to a single Damascene situation. As shown in FIG. 11A, the disclosed metallization process 500 begins with a workpiece 504 composed of dielectric layers 506 and 507 separated by a UV block layer 509, all positioned on a crystalline silicon wafer (not shown). As shown in the first step 502, via etch has been carried out on the workpiece to define a via 508.

Figure 11A:
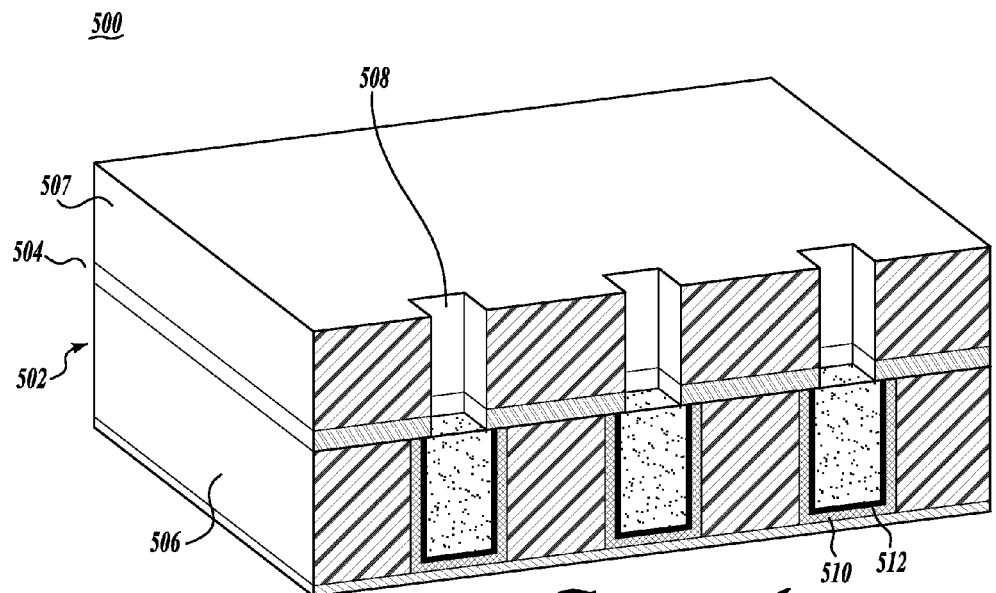
FIGS. 11A-11G is a schematic process diagram similar to FIGS. 8-10 but applicable to a single Damascene structure involving the creation of an alignment tolerant via.
Figure 11B:
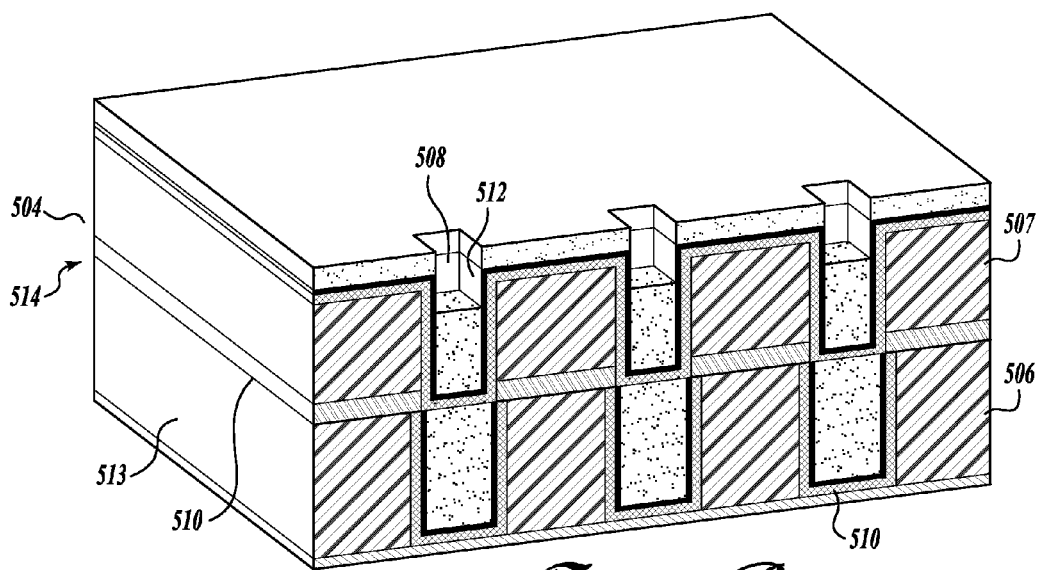
Figure 11C:
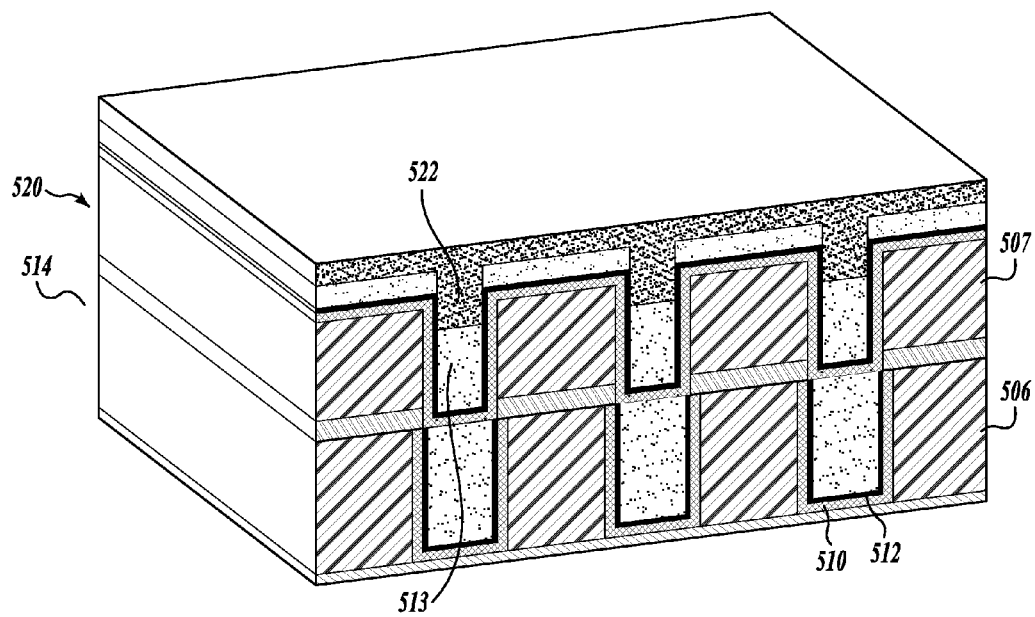
Figure 11D:
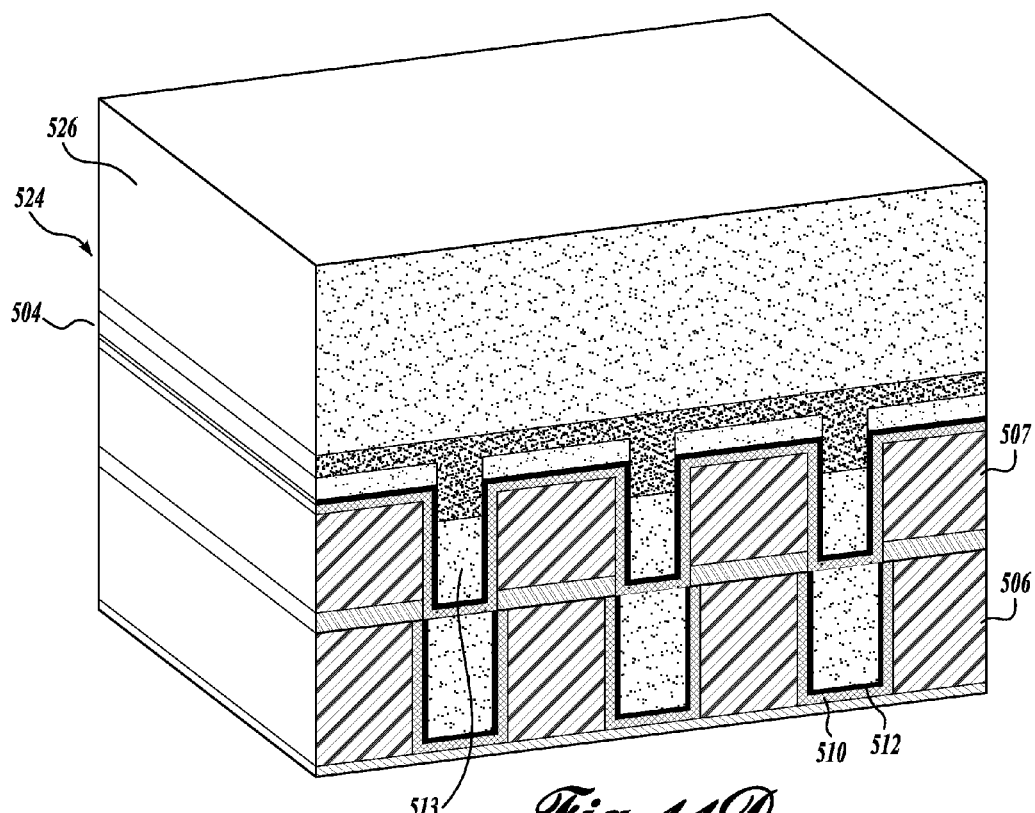
Figure 11E:
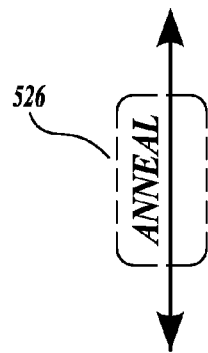

In the next step 514, shown in FIG. 11B, a barrier layer 510 is applied to the via 508. The barrier layer 510 can by applied as described above, including with respect to FIGS. 8 and 9. Thereafter, a platable seed layer 512 can be applied to the barrier layer in the manner described above. Alternatively, a platable film can be applied over the barrier layer, as also discussed above.

Also as shown in step 514 (FIG. 11B), the via is plated with a metal conductor 513, such as copper or copper alloy, using various techniques. This plating can be carried out using "bottom-up fill," which is a process known in the art, or using ECD or ECD seed "plus" refill processes. As described above, the ECD seed "plus" process includes applying a layer of ECD seed on the seed layer 517, next performing a thermal treatment. This treatment induces reflow of the copper 513 or other metalizing metal into the via 508 to perform a partial fill of the via. The ECD seed deposition step, the anneal step, and the reflow step can be repeated to achieve the desired characteristics of the via 508. In this regard, the number of times such steps are repeated may depend on the desired structure of the fill.

Next, in step 520 (FIG. 11C), a metal (such as Co or Cu) or a metal alloy 522 is plated or otherwise deposited in the via, and also overlays the ECD seed plus layer. The plating of the metal 522 can be carried out in a manner very similar to the alloying in steps 220 and 320, described above with respect to FIGS. 8 and 9. As also noted above, various alloying metals or combinations of alloying metals may be utilized. In addition, more than one alloy layer may be plated or deposited over the ECD seed plus fill layer.

In the next step 522 (FIG. 11D), a copper (or other metal) overburden 526 is plated on the alloy layer 522. The overburden layer 526, as discussed above, can be economically and relatively quickly applied by electroplating. However, other deposition methods may be used instead.

Figure 11F:
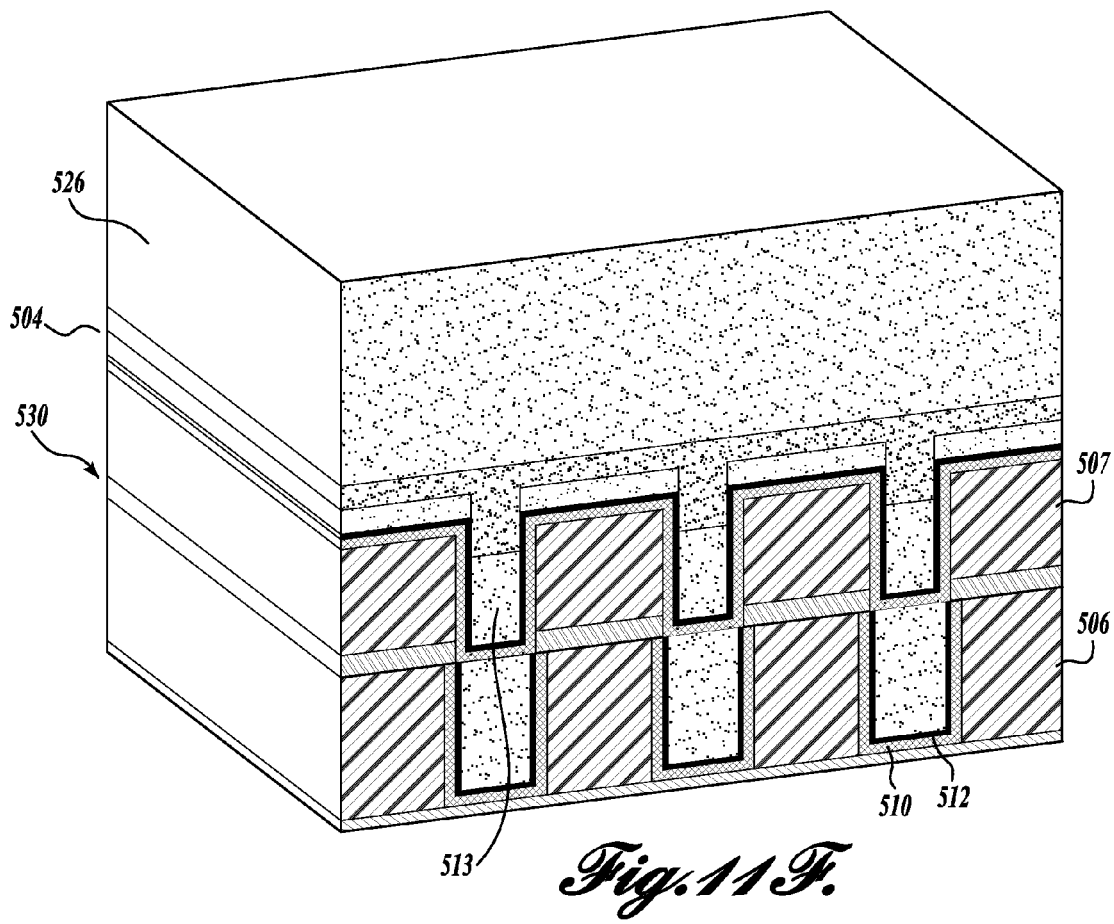

Next, in an optional step 528 (FIG. 11E), the workpiece 504 is annealed in a manner described above with respect to FIGS. 8-19. The annealing step 526 results in a controlled diffusion of the alloy in layer 522 into the adjacent top portion of the copper fill 513, in the via 508 (FIG. 11F). Annealing can be carried out under the conditions and in the manner described above with respect to other embodiments of the present disclosure.

Figure 11G:
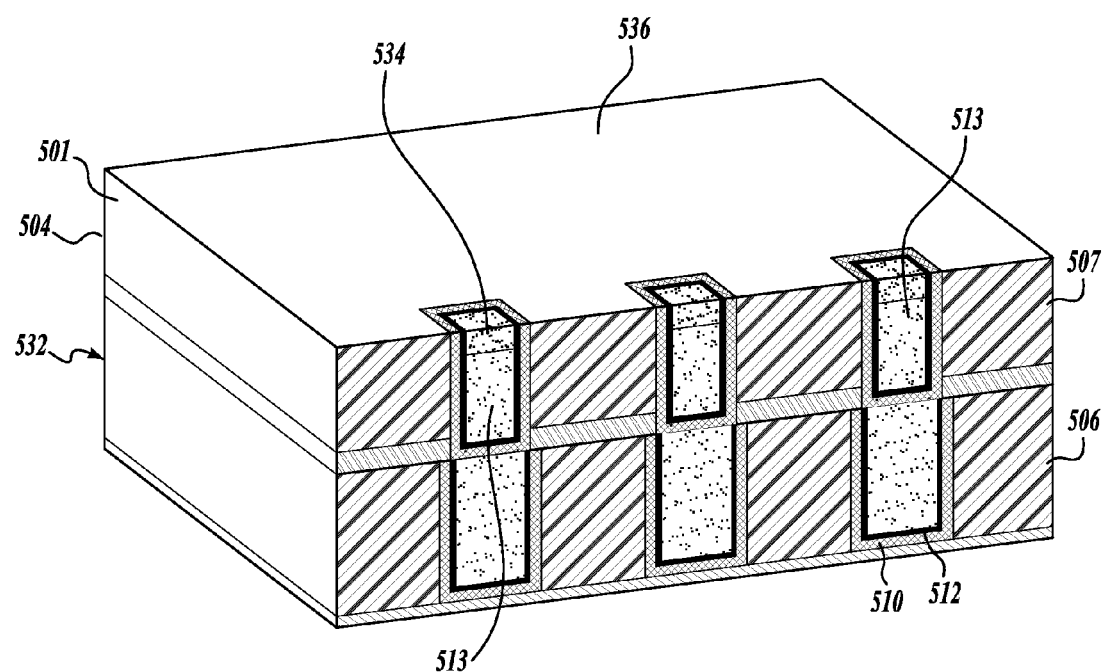

As shown in FIG. 11G, after the annealing procedure has been performed, CMP procedures are used to remove the copper overburden in step 532. In addition to the copper overburden, all of the other material layers are removed down to the dielectric 507. This leaves a selective cap 534 over the via 508, which is coextensive with the top surface 536 of the single Damascene dielectric layer 507. As will be appreciated, by using the CMP process, no metal residue is left between adjacent vias 508. Moreover, the selective cap 534 now serves as an etch stop layer for the next metallization layer applied over dielectric layer 507.

Figure 12:
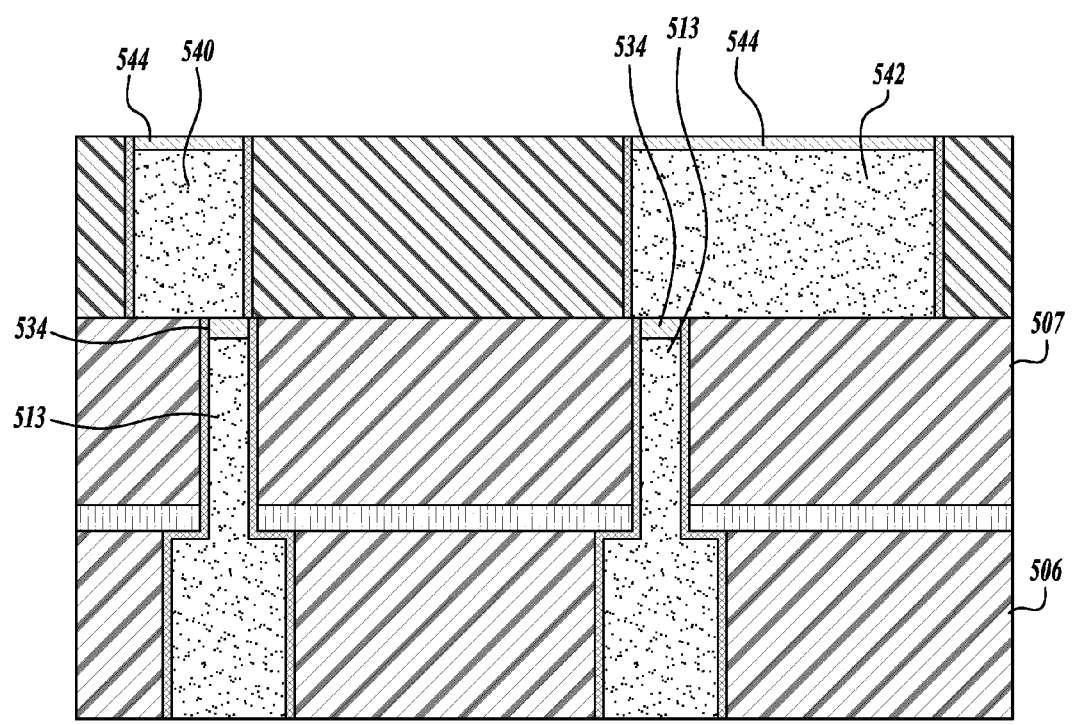
FIG. 12 is a schematic view of a structure illustrating the results of the method of the present disclosure in producing an alignment tolerant via overlaid with a further metallization layer.

As shown in FIG. 12, by the present process 500 an alignment tolerant via 508 is formed. Even if features 540 and 542, found in an overlying dielectric layer 544, overlap vias 508, the selective cap 534 retains a separation between features 540 and 542 and underlying vias 508. As can be appreciated, this enables workpieces to be produced with alignment tolerant vias 508, thereby facilitating the semiconductor fabrication and manufacturing processes.

In FIG. 12, the metallization of features 540 and 542 can be carried out in the same manner or in a manner similar to that described with respect to FIG. 8. In this regard, a selective metal cap 546 is formed over interconnects 540 and 542.

Alternative embodiments of the processes of the present disclosure may include variations of the steps already described above, which also are directed at improving the performance and reliability of interconnects by providing for a wider process window for self-aligned vias and for self-aligned trench over via in single and dual Damascene integration schemes. As noted above, the processes of the present disclosure allow for self-aligned selective metal caps disposed over metal lines to reduce electromigration occurrence. Also, embodiments of the present disclosure provide for a selective metal cap or etch stop over vias to not only assist in electromigration performance by preventing "bottomless vias," but also causing the vias to be alignment tolerant. Some embodiments of the present disclosure also include metal alloy plating and/or laminated metal plating as part of the metallization of the interconnect lines. Such alloys and metal laminates can be selected to improve electromigration performance.

Moreover, another advantage realized by the processes described herein is that a single tool, for example a Raider® electrochemical deposition, cleaning (e.g., SRD), and thermal treatment or anneal tool, manufactured by Applied Materials, Inc., can be used for carrying out the process steps described above. These process steps include the ECD seed deposition step (or steps if repeated), the cleaning step (or steps, if repeated), the thermal treatment step (or steps, if repeated), and the plating steps. As a result, workpieces do not have to be moved from location to location or machine to machine to perform the steps of the processes described above.

While illustrative embodiments have been illustrated and described, it will be appreciated that various changes can be made therein without departing from the spirit and scope of the invention. For example, the material deposition steps and procedures discussed above can be carried out using a multi-electrode system. Examples of such systems are set forth in U.S. Pat. Nos. 7,351,314, 7,351,315, and 8,236,159, incorporated herein by reference.

The embodiments of the invention in which an exclusive property or privilege is claimed are defined as follows:

1. A method for forming an interconnect in a workpiece, the method comprising:
    electrochemically depositing a second metallization layer on the workpiece comprising a nonmetallic substrate having a dielectric layer disposed over a substrate and a continuous first metallization layer disposed on the dielectric layer and having at least one microfeature comprising a recessed structure, wherein the first metallization layer at least partially fills a feature on the workpiece, where the first metallization layer is a single metal layer, and wherein the second metallization layer is a copper layer that is different from the metal of the first metallization layer;
    electrochemically depositing a copper cap layer after filling the feature; and
    annealing the workpiece to diffuse the metal of the second metallization layer into the metal of the first metallization layer.

2. The method of claim 1, wherein the first metallization layer is selected from the group consisting of cobalt, nickel, and copper layers.

3. The method of claim 1, wherein the second metallization layer is a copper or copper alloy layer.

4. The method of claim 3, wherein the alloying metal includes a transition or noble metal.

5. The method of claim 3, wherein the alloying metal is selected from the group consisting of Ag, Au, Co, Ni, Pd, and Pt.

6. The method of claim 1, wherein the first metallization layer is a seed layer.

7. The method of claim 1, wherein the second metallization layer partially fills the feature and further comprising electrochemically depositing a third metallization layer to further partially or completely fill the feature before the cap layer is applied.

8. The method of claim 7, wherein the third metallization layer is a copper or copper alloy layer.

9. The method of claim 1, wherein the annealing of the workpiece is carried out in a controlled manner to limit the diffusion of an alloying element of the second metallization layer to an upper portion of the feature.

10. The method of claim 1, wherein the annealing of the workpiece is carried out to cause the diffusion of an alloying element of the second metallization layer to uniformly diffuse throughout the feature.

11. The method of claim 1, wherein the workpiece further includes a barrier layer between the dielectric layer and the first metallization layer.

12. The method of claim 1, further comprising using CMP to expose an upper surface of the workpiece.

13. The method of claim 1, wherein the first metallization layer is a conformal layer.

14. The method of claim 13, further comprising annealing the workpiece prior to deposition of the second metallization layer to reflow the first metallization layer.

15. The method of claim 1, wherein the second metallization layer is a conformal layer.

16. The method of claim 15, further comprising annealing the workpiece prior to deposition of the second metallization layer to reflow the first metallization layer.

17. A method for forming an interconnect in a workpiece, the method comprising:
    electrochemically depositing a second metallization layer on the workpiece comprising a nonmetallic substrate having a dielectric layer disposed over a substrate and a continuous first metallization layer disposed on the dielectric layer and having at least one microfeature comprising a recessed structure, wherein the first metallization layer at least partially fills a feature on the workpiece, wherein the first metallization layer is a cobalt layer, and wherein the metal of the second metallization layer is a copper or copper alloy layer, and wherein the second metallization layer is a fill or cap layer;
    electrochemically depositing a copper cap layer after filling the feature; and
    annealing the workpiece to diffuse the metal of the second metallization layer into the metal of the first metallization layer.

18. A method for forming an interconnect in a workpiece, the method comprising:
    electrochemically depositing a second metallization layer on the workpiece comprising a nonmetallic substrate having a dielectric layer disposed over a substrate and a continuous first metallization layer disposed on the dielectric layer and having at least one microfeature comprising a recessed structure, wherein the first metallization layer at least partially fills a feature on the workpiece, where the metal of the first metallization layer is copper, and wherein the metal of the second metallization layer is a copper alloy;
    electrochemically depositing a copper cap layer after filling the feature; and
    annealing the workpiece to diffuse the metal of the second metallization layer into the metal of the first metallization layer.

* * * * *